United States Patent [19]
Yip et al.

[11] Patent Number: 5,662,485
[45] Date of Patent: Sep. 2, 1997

[54] PRINTED CIRCUIT BOARD CONNECTOR WITH LOCKING EJECTOR

[75] Inventors: Maxwell K. Yip, Hamden; Fredrick D. Hooper, Norwalk; James J. Keating, Bridgeport, all of Conn.; Carl C. Petersen, Mentor, Ohio

[73] Assignee: Framatome Connectors USA Inc., Norwalk, Conn.

[21] Appl. No.: 588,661

[22] Filed: Jan. 19, 1996

[51] Int. Cl.⁶ .................................................. H01R 13/62
[52] U.S. Cl. ............................................................ 439/157
[58] Field of Search ................................. 439/152–160, 439/328

[56] References Cited

U.S. PATENT DOCUMENTS

| | | | |
|---|---|---|---|
| 3,199,066 | 8/1965 | Eledge et al. | 339/176 |
| 3,665,375 | 5/1972 | Thoms et al. | 339/192 R |
| 3,740,698 | 6/1973 | Jerominek | 339/17 F |
| 4,178,051 | 12/1979 | Kocher et al. | 339/45 M |
| 4,214,800 | 7/1980 | Hollyday et al. | 339/45 M |
| 4,293,179 | 10/1981 | Vonder | 339/176 MP |
| 4,445,740 | 5/1984 | Wallace | 339/45 M |
| 4,447,101 | 5/1984 | Guguliotti | 339/45 M |
| 4,469,388 | 9/1984 | Narozny | 339/45 M |
| 4,487,468 | 12/1984 | Fedder et al. | 339/75 MP |
| 4,531,795 | 7/1985 | Sinclair | 339/45 M |
| 4,713,013 | 12/1987 | Regnier et al. | 439/62 |
| 4,846,734 | 7/1989 | Lytle | 439/637 |
| 4,862,447 | 8/1989 | Forker et al. | 439/328 |
| 4,934,961 | 6/1990 | Piorunneck et al. | 439/637 |
| 5,002,498 | 3/1991 | Takahashi | 439/326 |
| 5,052,936 | 10/1991 | Biechler et al. | 439/60 |
| 5,181,857 | 1/1993 | Layser | 439/157 |
| 5,232,374 | 8/1993 | Iino | 439/157 |
| 5,364,282 | 11/1994 | Tondreault | 439/157 |
| 5,374,197 | 12/1994 | Uratsuji | 439/71 |
| 5,380,213 | 1/1995 | Piorunneck et al. | 439/160 |
| 5,387,115 | 2/1995 | Kozel et al. | 439/157 |
| 5,389,000 | 2/1995 | DiViesti et al. | 439/157 |
| 5,407,365 | 4/1995 | Lin | 439/636 |
| 5,445,531 | 8/1995 | Billman et al. | 439/157 |
| 5,470,240 | 11/1995 | Suzuki | 439/157 |
| 5,470,242 | 11/1995 | Cheng et al. | 439/157 |

OTHER PUBLICATIONS

AMP Dual Read–Out SIMM Sockets, Catalog 92934, Revised Feb. 1993, pp. 1–4.

*Primary Examiner*—Neil Abrams
*Assistant Examiner*—Brian J. Biggi
*Attorney, Agent, or Firm*—Perman & Green, LLP

[57] ABSTRACT

An improved ejector and housing connection is accomplished by forming a base portion of the housing with an internal confine for receiving a foot portion of an ejector base section which is made relatively wider than the elongated body portion of the ejector so that the foot section can be used as a stop within the correspondingly widened portion of the housing. The elongated body portion of the ejector is formed with detent members which coact within dovetail shaped grooves formed in the housing wall to maintain the ejector in a locked condition.

20 Claims, 3 Drawing Sheets

1

PRINTED CIRCUIT BOARD CONNECTOR WITH LOCKING EJECTOR

BACKGROUND OF THE INVENTION

The present invention relates generally to an edge card connector, and deals more specifically with an improved housing design and compatible ejector mechanism for maintaining the ejector in a locked condition.

Edge card connectors which electrically connect a daughter board to a mother board within the limited space of a computer or other like electronic device are well known. Usually the connector includes a housing provided with contacts which effect an electrical connection between the circuits of the connected mother and daughter boards. Mounted to the housing is at least one ejector mechanism which serves as a lever for moving the daughter board out of the housing upon pivoting of the ejector in a downward direction. However, such ejectors have a dual purpose in that located at the top end of each ejector is a cantilevered extension which is received within a correspondingly sized and shaped slot in the daughter board when the ejector is in its locked or upright condition. The ejector thus has dual purposes in that it also functions to mechanically lock the daughter card to the connector and hence to the mother board. It therefore plays an important role in keeping the mother and daughter boards locked, and preventing the boards from being inadvertently disconnected in the event that the daughter board is accidentally moved relative to the mother board.

Accordingly it is an object of the present invention to provide an improved edge card connector of the type wherein the ejectors are configured for positive locking engagement with the housing when in a locked condition.

Still a further object of the present invention is to provide an improved ejector and housing configuration whereby the housing and ejector are complimentarily configured to provide coacting overtravel stop surfaces disposed between a section of the ejector and the housing which with efficiency of space.

SUMMARY OF THE INVENTION

The invention resides in an edge card connector comprised of an elongate housing having a central section and a card receiving area therein. The housing further includes two end sections each disposed on opposite ends of the central section. An ejector is mounted to the housing within each of the two end sections. The ejector has an elongated body portion integrally formed with a finger contact section at one end and a mounting section at the other end. The mounting section further includes a foot section integrally formed therewith, with the foot section extending outwardly of the body section and communicating with a portion of the card receiving area. Each end section includes a hollow internal confine which is correspondingly sized and shaped to receive the foot section of the ejector and communicates with the card receiving area.

Preferably, the body portion of the ejector includes at least one detent member formed by spaced apart removed portions of body section material allowing the detent member to be laterally deflectable relative to the body portion.

DETAILED DESCRIPTION OF THE PREFERRED EMBODIMENT

Figure 1:
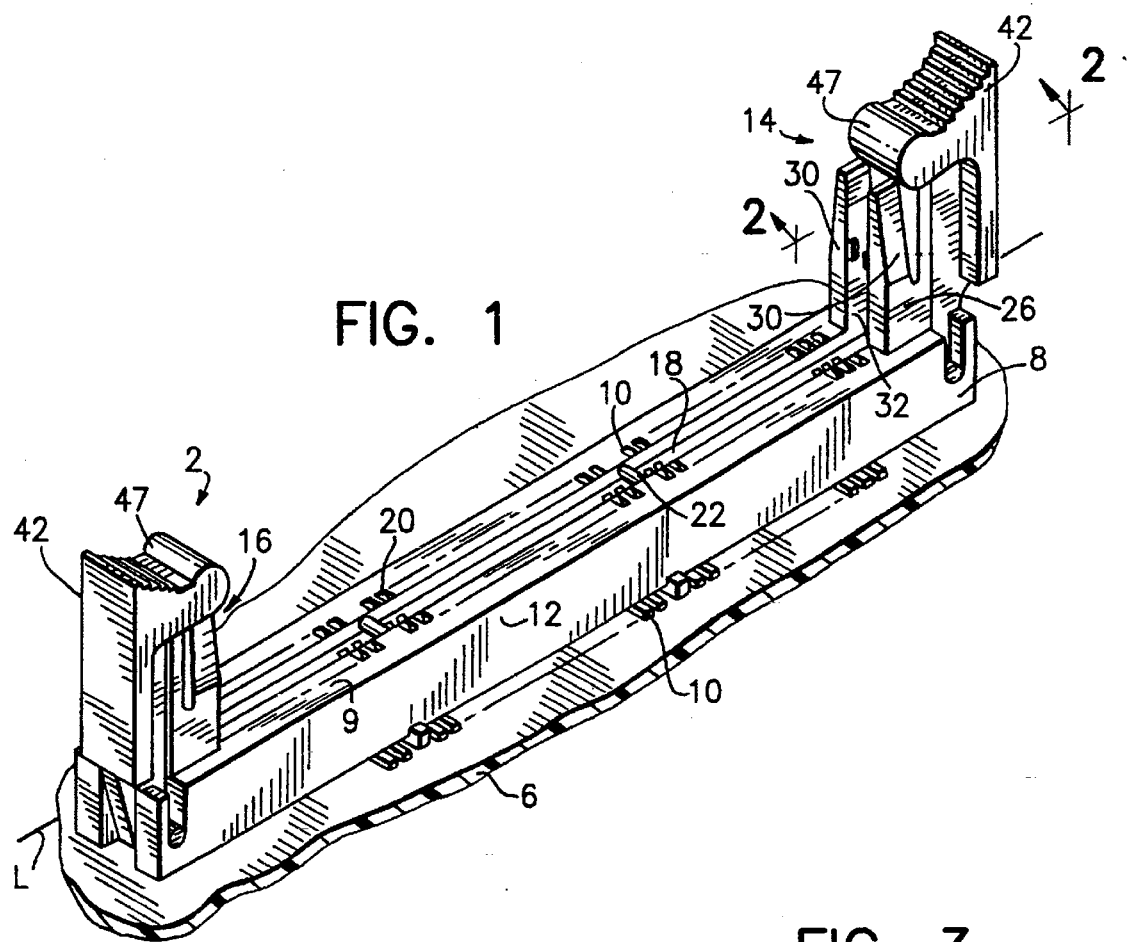
FIG. 1 is a perspective view of the connector as attached to a mother board showing the ejectors in their closed locking condition.

Referring to FIG. 1–5, there is shown a card edge electrical connector 2 for connecting a daughter printed board (not shown) to a mother printed circuit board 6. The connector 2 generally comprises a housing 8 and a plurality of electrical contacts 10. The housing is comprised of a one piece molded dielectric polymer or plastic material. The housing 8 includes an elongated center section 12 extending along a longitudinal axis L and having a top surface 9. Two end sections 14 and 16 are integrally formed with the center section 12 and are disposed at opposite ends thereof. The center section 12 has a card receiving area or recess 18 and contact channels 20. The card receiving area 18 is suitably sized and shaped to receive the card edge connection area of the daughter board therewithin. Polarized ridges 22 are provided in the receiving area 18 to prevent misconnection of the daughter board as is generally known in the card edge technology. The contact channels 20 are located on opposite sides of the receiving area 18 as two parallel rows with windows which open to the receiving area 18 and contain contacts 10 therewithin.

The end sections 14 and 16 are basically mirror images of each other and include a raised post section 24 with each post section having a tapered base 26 and a top end portion 28 extending up from the tapered base 26 and including two opposite side guides 30. The top end portions and the side guides all extend up from the tapered base 26 in a generally cantilevered fashion. Each end section includes a vertically extending slot 32 for receiving a portion of the daughter board. Each slot is defined by an open end of the top end portion 28 and the associated opposed side guides 30. The interior surface 21 of the side guides have interference stabilizer projections 34. The projections are adapted to effect an interference gripping with a daughter board inserted into the area. The end sections thus function as both guides for allowing proper insertion of the daughter board into the card edge receiving slot and for gripping and locking the daughter board to the housing once the daughter board is inserted therein.

Each raised post section 24 of the housing also includes an end wall 36 into which is formed a vertically extending ejector slot 38. The ejector slot 38 and the card receiving slot 32 are aligned coincidentally with the longitudinal axis L but are separated from one another by a vertically extending separation wall 39 which is integrally formed with the base 26 and extends vertically upwardly therefrom. The ejector slot 38 is defined by two parallel vertically extending side walls 40 which are spaced apart from one another by the dimension W and extend perpendicularly outwardly from the separation wall 39. Each side wall 40 extends vertically between the base 26 and the top end portion 28 of the post.

Figure 8:
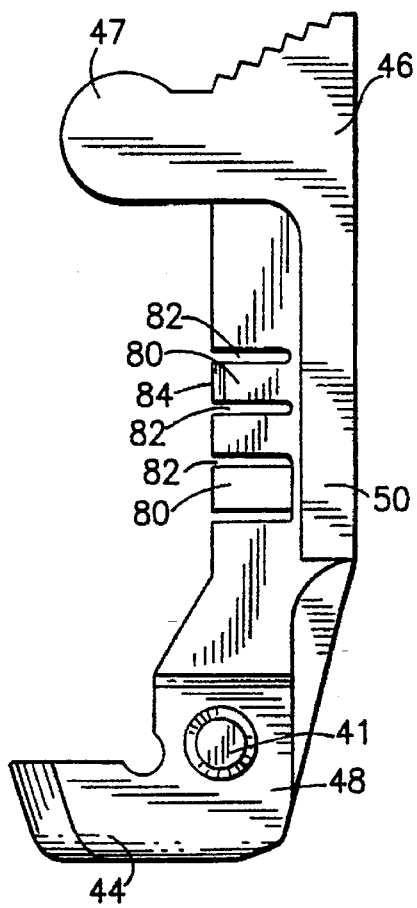
FIG. 8 is a side elevation view of the ejector member.
Figure 9:
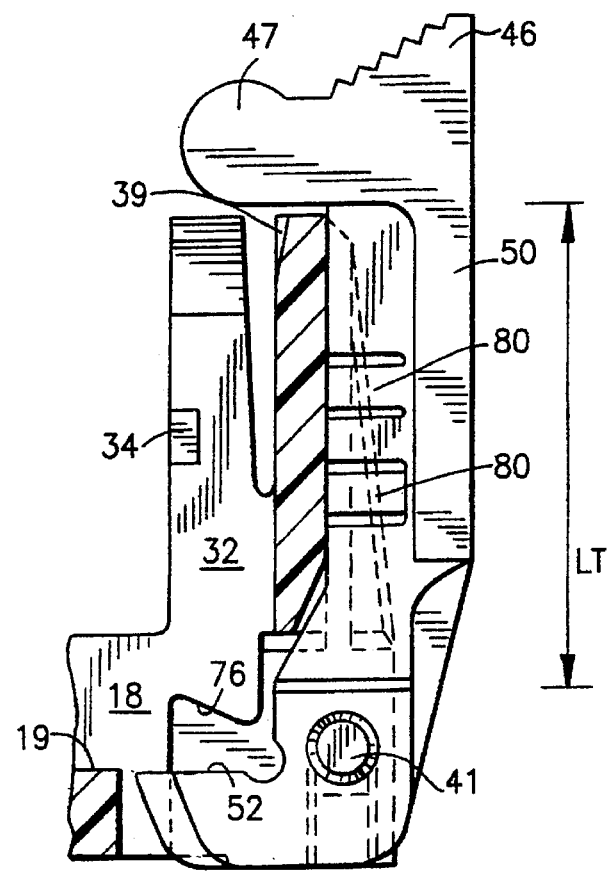
FIG. 9 is a partially fragmentary vertical section view taken along line 2—2 of FIG. 1 showing the ejector as assembled with the connector housing.

As seen in FIGS. 1, 8 and 9, ejector members 42 are provided as part of the connector 2 and are correspondingly sized and shaped to be received within each ejector slot 38 formed in the end sections 14 and 16 of the connector. Each ejector is comprised of a one piece molded dielectric polymer or plastic material having an ejector foot section 44, a finger contact section 46, a mounting section 48 and an elongated body section 50 disposed between the finger contact section 46 and the foot section 44. The mounting section 48 is provided with two laterally extending cylindric boss members 41 which are integrally formed with the ejector for snap fit connection with the housing 8. The finger contact section includes a cantilevered extension 47 which is correspondingly sized and shaped to be received with a cutout formed in the daughter board-as is standard in the industry.

Figure 6:
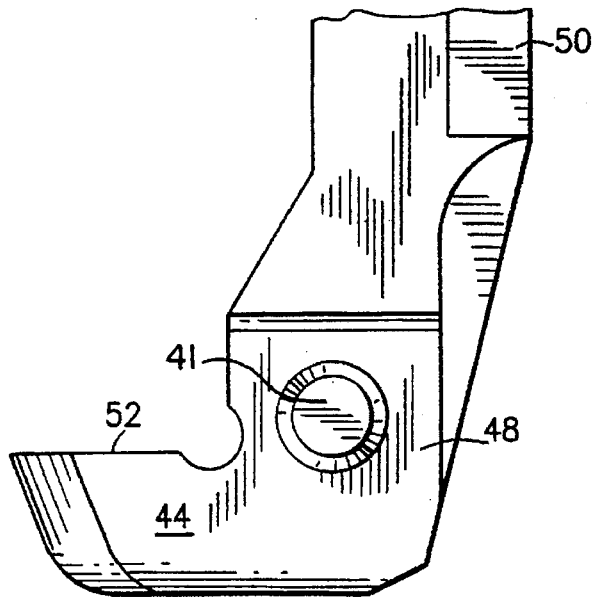
FIG. 6 is a partially fragmentary side view of the lower foot section of the ejector member.
Figure 7:
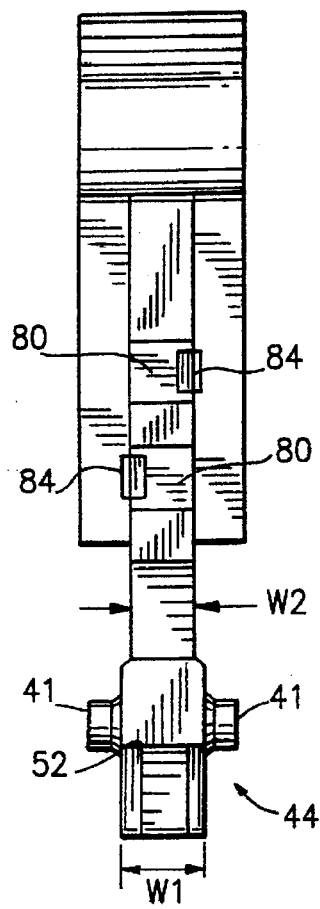
FIG. 7 is a front elevation view of the ejector shown in FIG. 8 as seen looking at the ejector from the left.

As shown in FIGS. 6 and 7, the foot section 44 includes a top surface 52 against which the bottom edge surface of the daughter board rests as is known in the industry. The foot section has a width W1 which is slightly wider in dimension than the width W2 of the elongated body portion. As will become apparent later, the relative difference between the widths of the foot section 44 and the body section 50 is important in providing an overtravel stop for the ejector internally of the housing 8.

Referring back to FIGS. 2 and 3, the base 26 of each raised post section 24 has an internal hollow confine 56 communicating with an opening 58 formed in the bottom surface of the base 26. The internal confine also communicates with the card receiving area 18 of the center section 12 of the connector housing 8.

Formed in each of the side walls 40 is a vertically extending first channel 60 which opens coincidentally with the bottom opening 58 in the base and communicates with the internal confine 56. The first vertical channels 60 terminate within each side wall 40 in first arcuate half circle surfaces 66. A second vertical channel 64 is formed in the housing 8 immediately laterally outwardly of each first vertical channel 60. Each second vertical channel 64 opens inversely relative to the first channels 60. That is, the second vertical channel opens upwardly to the top surface 9 of the housing 8 and extends downwardly therefrom ending in a second arcuate half circle surface 68. The first and second vertical channels 60 and 64 are correspondingly sized and shaped to receive the outer diameter of the laterally extending cylindric boss members 41 which extend from the foot section 44 of the ejector 42.

Figure 4:
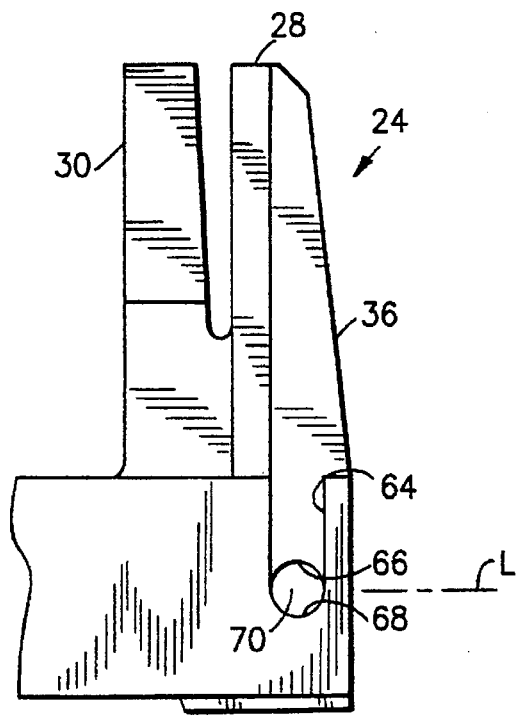
FIG. 4 is a partially fragmentary side elevation view of one end of the connector housing.
Figure 5:
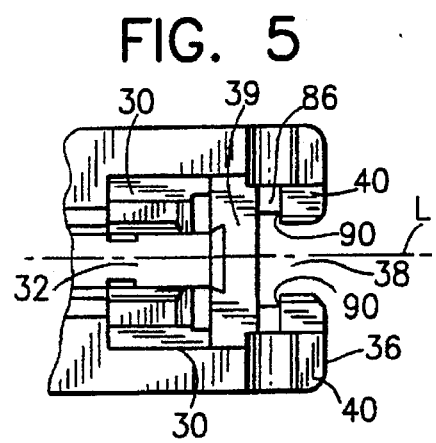
FIG. 5 is partially fragmentary top plan view of the connector end shown in FIG. 5.

As best illustrated in FIG. 4, the first and second channels 60 and 64 are so dimensioned lengthwise that each terminates within the side walls 40 and the base 26, respectively, such that a cylindric aperture 70 is formed by the contribution of the two opposing laterally spaced arcuate half circle surfaces 66 and 68, which together form a circular opening as seen in side view adapted to receive a respective one of the cylindric boss members 41.

Figure 2:
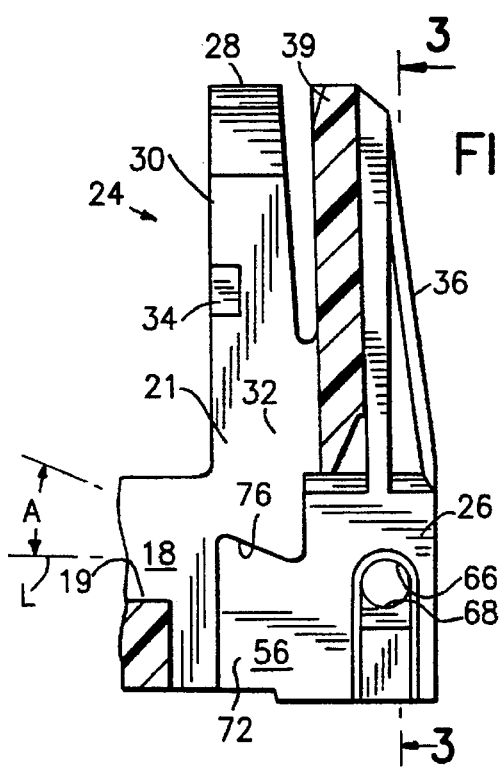
FIG. 2 is a partially fragmentary sectional view taken along line 2—2 in FIG. 1 with the ejector removed for clarity.
Figure 3:
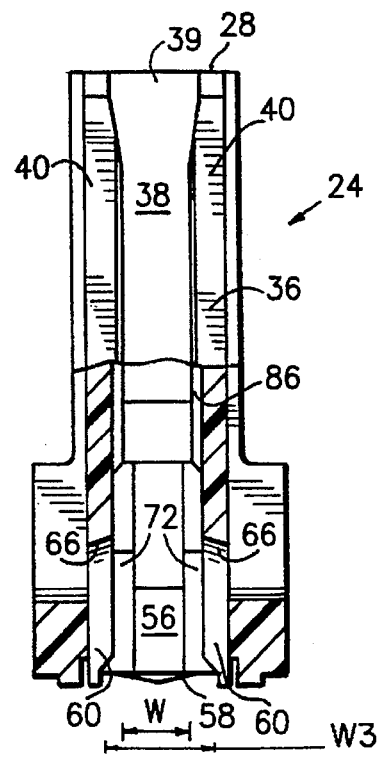
FIG. 3 is a vertical sectional view taken along line 3—3 in FIG. 2.

As previously discussed, the ejector body section 50 as seen in FIG. 7, has a width W1 which is slightly smaller in dimension than the width W of the ejector slog 38 and thus is received therein. The foot section 44 of the ejector however, has a dimension W2 which is of a dimension greater than the width dimension W1 of the body section so as to use the lateral side portions of the top surface 52 as a stop surface for the ejector. As best seen in FIG. 2, the internal confine 56 formed in the base 26 includes two cut-outs 72 each associated with a lateral side of the confine 56 extending parallel to the longitudinal axis L. Each of the cut-outs 72 extends inwardly into the center section 12 so as to terminate just proximate the bottom surface 19 of the card receiving recess 18 and in the inner surface 21 of the side guides 30. The intersection of the cut-outs with the inner surface 21 of the guides 30 defines a stop face 76 extending at an angle A to the axis L equalling about 30 degrees.

The cut-outs 72 define a widened width W3 extension of the confine 56 which is slightly larger than the width W2 of the foot section 44 in order to receive the foot section therewithin. Thus, when the ejector 42 is assembled within the housing, the top surface 52 of the foot section 44 as seen in FIG. 9 lies coextensively with the bottom surface 19 of the recess 18 when in the locked condition, and coacts against the stop faces 76 when the ejector is pivoted down from its locked condition to serve as an overtravel stop.

The ejector 42 is assembled into the housing by inverting it from its otherwise upright condition shown in FIG. 8 such that the foot section 44 is introduced first into the opening 58 in the bottom of the body portion 50. The ejector is pushed vertically upwardly with the laterally extending cylindrical bosses 62 received and squeezed within the inner surfaces of the first channels 60, until upon continued upward movement, each boss 41 is snap inserted into the cylindric apertures 70 whereupon it is rotated it its upright condition.

As shown in FIG. 8, the elongated body portion 50 of the ejector 42 is provided with a plurality of laterally deflectable detent members 80 which are disposed longitudinally along the length of the body portion 50. The detent members 80 are formed by removed sections 82 of material which are either cut or molded into the elongated body portion 50. Additionally, each detent member includes a laterally outwardly directed tooth 84 which is correspondingly sized and shaped to be received within a vertically extending edges 90 defining a dovetailed groove 86 formed in the side of the separation wall 39 forming the ejector slot 38. As illustrated in FIG. 9, the detent members 80 are resiliently snapped into place behind the edges 90 within the dovetail groove through cantilever deflection as the ejector is rotated to its locked upright condition as shown in the illustrated embodiment.

It should be further be appreciated from FIG. 9 that the length LT of the body portion 50 is selected such that when the ejector 42 is snap fit into place within the cylindric apertures 70 in the housing 8, the cantilevered extensions 47 are positioned above the separation wall 39 and extend substantially into the card receiving area 18 for insertion into a correspondingly sized cutout formed in the daughter card.

By the foregoing, an improved ejector housing connection has been disclosed in a preferred embodiment. However, numerous modifications and substitutions may be had without departing from the spirit of the invention. For example, the terms inward and outwardly laterally and longitudinally, and vertically and downwardly, are used primarily as descriptive terms and should not be taken to limit the invention.

Accordingly the invention has been described by way of illustration rather than limitation.

What is claimed is:

1. In an edge card connector an ejector comprising:
    an elongated body portion integrally formed with a finger contact section at one end and a mounting section at the other end;

said mounting section further including a foot section integrally formed therewith;

said foot section extending outwardly of said body section; and wherein said body portion includes at least one detent member formed by spaced apart removed portions of body section material allowing said detent to be laterally deflectable relative to the body portion with said detent member further including a laterally extending tooth engageable with a corresponding surface on said housing.

2. A connector as defined in claim 1 further characterized in that said foot section includes a top foot surface which has a width dimension which is wider than the width of said body section.

3. A connector as defined in claim 2 further characterized in that said finger contact section includes a cantilevered extension extending therefrom in the same direction as said foot section.

4. A connector as defined in claim 3 further characterized by said body portion of said ejector has a length sufficient to position the cantilevered extension above an upstanding wall of the housing.

5. An edge card connector comprising:

elongate housing having a central section and a card receiving area therein; said housing further including two end sections each disposed on opposite ends of said central section and having a vertically extending separation wall;

an ejector mounted to the housing within each of said two end sections; said ejector having an elongated body portion integrally formed with a finger contact section at one end and a mounting section at the other end, said mounting section further including a foot section integrally formed therewith, said foot section extending outwardly of said body section and communicating with a portion of said card receiving area, and wherein said body portion of said ejector includes at least one detent member formed by spaced apart removed portions of body section material allowing said detent to be laterally deflectable relative to the body portion with said detent member further including a laterally extending tooth engageable with a corresponding surface on said separation wall.

6. A connector as defined in claim 5 further characterized in that said foot section includes a top foot surface which has a width dimension which is wider than the width of said body section and each of end sections of said housing having a hollow internal confine with sides defining cut-outs communicating with said card receiving area, said cutouts being spaced apart from one another in each of said end sections so as to receive the widened width dimension of said foot section.

7. A connector as defined in claim 6 further characterized by each of said end sections including opposed side guides having opposed inner surfaces, said cut-outs intersecting with an associated one of said inner surfaces and creating a stop face against which said top surface of said foot section abuts for contacting the base of a circuit board inserted into the housing and for engaging with a correspondingly shaped and sized stop face formed in said housing.

8. A connector as defined in claim 7 further characterized in that said ejector is formed from deflectable plastic.

9. A connector as defined in claim 8 further characterized in that each of said end sections includes two spaced side walls extending perpendicularly thereto, said side walls being spaced apart sufficiently to receive the body portion of said ejector therebetween.

10. A connector as defined in claim 9 further characterized by said body portion of said ejector having a length sufficient to position the cantilevered extension above said upstanding separation wall of the housing.

11. A connector as defined in claim 10 further characterized in that said housing end sections each include first and second channels with said first channels terminating within each side wall in first arcuate half circle surfaces and said second vertical channels are formed in said housing immediately laterally outwardly of a respective one of each first vertical channels with each of said second vertical channels opening inversely relative to the first vertical channel and terminating in a second arcuate half circle.

12. A connector as defined in claim 11 further characterized by said ejector mounting section having laterally extending cylindric boss members which extend outwardly from the foot section of the ejector, said first and second vertical channels being correspondingly sized and shaped to receive the outer diameter of the laterally extending cylindric boss members of the ejector.

13. A connector as defined in claim 12 further characterized in that said first and second arcuate half circle surfaces terminating adjacent one another such that each first and second arcuate half circle pair defines a circular aperture as seen in side view.

14. An edge card connector comprising:

an elongate housing having a central section and a card receiving area therein; said housing further including two end sections each disposed on opposite ends of said central section;

an ejector mounted to the housing within each of said two end sections; said ejector having an elongated body portion integrally formed with a finger contact section at one end and a mounting section at the other end, said mounting section further including a foot section integrally formed therewith, said foot section extending outwardly of said body section and communicating with a portion of said card receiving area; and said foot section includes a top foot surface which has a width dimension which is wider than the width of said body section, and each of said end sections of said housing having a hollow internal confine with sides defining cut-outs defined in part by stop faces communicating with said card receiving area, said cutouts being spaced apart from one another in each of said end sections so as to receive the widened width dimension of said foot section and to cause the top foot surface of said foot section along each lateral side thereof to coact against respective ones of said stop faces of said cut-outs when the ejector is pivoted from an otherwise locked condition.

15. A connector as defined in claim 14 further characterized by each of said end sections including opposed side guides having opposed inner surfaces, said cut-outs intersecting with an associated one of said inner surfaces and creating said stop faces against which said top surface of said foot section abuts.

16. A connector as defined in claim 15 further characterized in that each of said end sections includes a vertically extending wall and two spaced side walls extending perpendicularly thereto, said side walls being spaced apart sufficiently to receive the body portion of said ejector therebetween.

17. A connector as defined in claim 16 further characterized by said body portion of said ejector having a length sufficient to position the cantilevered extension above said upstanding wall of the housing.

18. A connector as defined in claim 17 further characterized in that said housing end sections each include first and second channels with said first channels terminating within each side wall in first arcuate half circle surfaces and said second vertical channels are formed in said housing immediately laterally outwardly of respective ones of each first vertical channels with each of said second vertical channels opening inversely relative to the first vertical channel and terminating in a second arcuate half circle.

19. A connector as defined in claim 18 further characterized by said ejector mounting section having laterally extending cylindric boss members which extend outwardly from the foot section of the ejector, said first and second channels being correspondingly sized and shaped to receive the outer diameter of the laterally extending cylindric boss members which extend from the foot section of the ejector.

20. A connector as defined in claim 19 further characterized by said body portion of said ejector includes at least one detent member formed by spaced apart removed portions of body section material allowing said detent to be laterally deflectable relative to the body portion with said detent member further including a laterally extending tooth engageable with dovetailed grooved extending vertically along the length of said separation wall.

* * * * *